US008128834B2

(12) United States Patent
Yura et al.

(10) Patent No.: US 8,128,834 B2
(45) Date of Patent: *Mar. 6, 2012

(54) PIEZOELECTRIC/ELECTROSTRICTIVE PORCELAIN COMPOSITION AND PIEZOELECTRIC/ELECTROSTRICTIVE ELEMENT

(75) Inventors: Yukinobu Yura, Nagoya (JP); Hirofumi Yamaguchi, Nagoya (JP); Ritsu Tanaka, Nagoya (JP)

(73) Assignee: NGK Insulators, Ltd., Nagoya (JP)

(*) Notice: Subject to any disclaimer, the term of this patent is extended or adjusted under 35 U.S.C. 154(b) by 742 days.

This patent is subject to a terminal disclaimer.

(21) Appl. No.: 12/036,373

(22) Filed: Feb. 25, 2008

(65) Prior Publication Data

US 2008/0302996 A1   Dec. 11, 2008

(30) Foreign Application Priority Data

Feb. 27, 2007 (JP) ................... 2007-046658
Dec. 28, 2007 (JP) ................... 2007-338923

(51) Int. Cl.
*C04B 35/49* (2006.01)
(52) U.S. Cl. ............... 252/62.9 R; 501/134; 310/311
(58) Field of Classification Search ............. 252/62.9 R; 501/134; 310/311
See application file for complete search history.

(56) References Cited

U.S. PATENT DOCUMENTS

| 7,101,491 | B2 | 9/2006 | Nonoyama et al. |
| 7,309,450 | B2 | 12/2007 | Nanao et al. |
| 2006/0006360 | A1* | 1/2006 | Takao et al. ............... 252/62.9 R |
| 2006/0066176 | A1 | 3/2006 | Nanataki et al. |
| 2006/0202170 | A1 | 9/2006 | Koizumi et al. |
| 2007/0200084 | A1* | 8/2007 | Wang et al. ............... 252/62.9 R |
| 2008/0095927 | A1 | 4/2008 | Nanataki et al. |

FOREIGN PATENT DOCUMENTS

| EP | 1 702 906 A1 | | 9/2006 |
| JP | 50-47193 | * | 4/1975 |
| JP | 56-120180 | * | 9/1981 |
| JP | 56-120180 A1 | | 9/1981 |
| JP | 2003-277145 A1 | | 10/2003 |
| JP | 2004-155601 | * | 6/2004 |
| JP | 2004-244302 A1 | | 9/2004 |
| JP | 2004-323325 A1 | | 11/2004 |
| JP | 2005-179144 A1 | | 7/2005 |
| JP | 2006-315909 A1 | | 11/2006 |
| WO | 2006/095716 A1 | | 9/2006 |

* cited by examiner

*Primary Examiner* — Carol M Koslow
(74) *Attorney, Agent, or Firm* — Burr & Brown

(57) ABSTRACT

A (Li, Na, K)(Nb, Ta)$O_3$ based piezoelectric/electrostrictive porcelain composition obtained by adding a slight amount of a Mn compound to a perovskite type oxide containing Li, Na and K as A-site elements and contains at least Nb out of Nb and Ta as B-site elements, where a ratio of a total number of atoms of the A-site elements to a total number of atoms of the B-site elements is not smaller than 1. A composition of the perovskite type oxide as a principal component is represented by a general formula: $\{Li_y(Na_{1-x}K_x)_{1-y}\}_a(Nb_{1-z}Ta_z)O_3$. The A/B ratio "a" preferably satisfies $1<a\leq1.05$. The Mn compound as an accessory component is desirably added such that the added amount is not more than 3 parts by mol in terms of Mn atom with respect to 100 parts by mol of said perovskite type oxide.

6 Claims, 5 Drawing Sheets

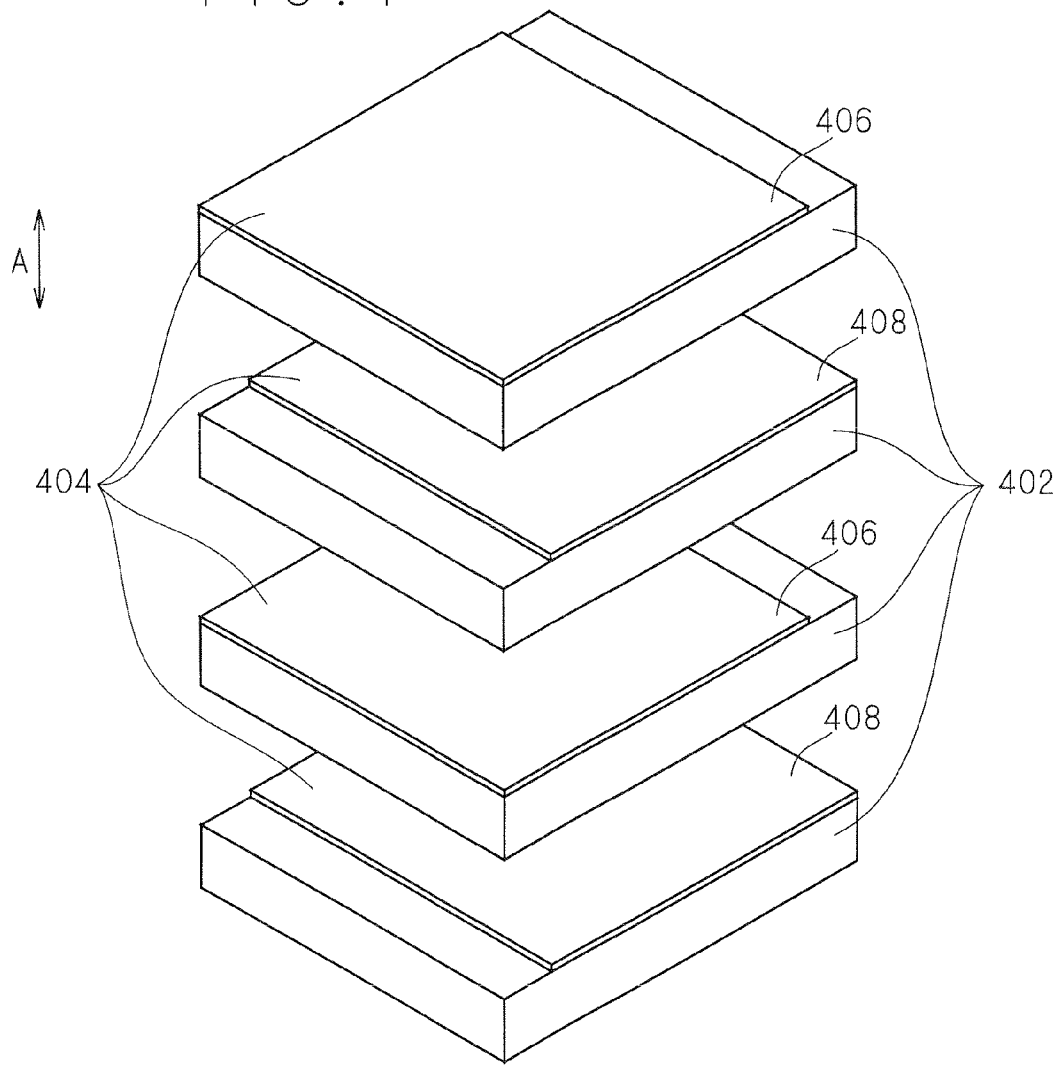

PIEZOELECTRIC/ELECTROSTRICTIVE PORCELAIN COMPOSITION AND PIEZOELECTRIC/ELECTROSTRICTIVE ELEMENT

FIELD OF THE INVENTION

The present invention relates to a piezoelectric/electrostrictive porcelain composition, and a piezoelectric/electrostrictive element using the piezoelectric/electrostrictive porcelain composition.

BACKGROUND OF THE INVENTION

A piezoelectric/electrostrictive actuator has an advantage of being capable of precisely controlling displacement in a submicron order. Especially, a piezoelectric/electrostrictive actuator using a sintered body of a piezoelectric/electrostrictive porcelain composition as piezoelectric/electrostrictive body has advantages of high electromechanical conversion efficiency, large generative force, high-speed response, high durability, and low power consumption, in addition to the advantage of being capable of precisely controlling displacement. Drawing on these advantages, the piezoelectric/electrostrictive porcelain actuator has been adopted to a head of ink jet printer and an injector of a diesel engine.

As the piezoelectric/electrostrictive porcelain composition for the piezoelectric/electrostrictive actuator, a Pb (Zr, Ti)$O_3$ (PZT) based composition has hitherto been used. However, since an influence exerted by elution of lead from the sintered body on global environment has become a deep concern, a (Li, Na, K)(Nb, Ta)$O_3$ based composition has also been considered. It is however noted that there are many cases where the (Li, Na, K)(Nb, Ta)$O_3$ piezoelectric/electrostrictive porcelain composition is used with a Mn compound added thereto since performing a poling process on the composition as it is difficult.

For example, Japanese Patent Application Laid-Open No. 2004-244302 discloses a piezoelectric/electrostrictive porcelain composition represented by a general formula: $\{Li_x(K_{1-y}Na_y)_{1-x}\}(Nb_{1-z-w}Ta_zSb_w)O_3$ which was obtained by adding a Mn compound to a perovskite type oxide.

However, the (Li, Na, K)(Nb, Ta)$O_3$ based piezoelectric/electrostrictive porcelain composition easily becomes hardened by addition of the Mn compound, and there has thus been a problem in that electric field induced strain, which occurs at the time of applying a high electric field and is of importance for the piezoelectric/electrostrictive actuator, decreases due to addition of the Mn compound.

SUMMARY OF THE INVENTION

The present invention relates to a piezoelectric/electrostrictive porcelain composition and a piezoelectric/electrostrictive element using the piezoelectric/electrostrictive porcelain composition.

According to the present invention, a piezoelectric/electrostrictive porcelain composition, comprises a perovskite type oxide, containing Li, Na and K as A-site elements and contains at least Nb out of Nb and Ta as B-site elements, where a ratio of a total number of atoms of the A-site elements to a total number of atoms of the B-site elements is not smaller than 1 and a Mn compound, added to said perovskite type oxide.

It is thereby possible to realize a (Li, Na, K)(Nb, Ta)$O_3$ based piezoelectric/electrostrictive porcelain composition, having large electric field induced strain at the time of applying a high electric field while being easily subjected to a poling process.

Further, the present invention is also directed to the piezoelectric/electrostrictive element using the piezoelectric/electrostrictive porcelain composition.

According to one aspect of the present invention, a piezoelectric/electrostrictive element is provided, comprising a piezoelectric/electrostrictive film as a sintered body of a piezoelectric/electrostrictive porcelain composition, and electrode films on both principal surfaces of the piezoelectric/electrostrictive film. The piezoelectric/electrostrictive porcelain composition comprises a perovskite type oxide, containing Li, Na and K as A-site elements and contains at least Nb out of Nb and Ta as B-site elements, where a ratio of a total number of atoms of the A-site elements to a total number of atoms of the B-site elements is not smaller than 1, and a Mn compound, added to the perovskite type oxide.

Accordingly, an object of the present invention is to realize a (Li, Na, K)(Nb, Ta)$O_3$ based piezoelectric/electrostrictive porcelain composition, having large electric field induced strain at the time of applying a high electric field while being easily subjected to the poling process.

These and other objects, features, aspects and advantages of the present invention will become more apparent from the following detailed description of the present invention when taken in conjunction with the accompanying drawings.

BRIEF DESCRIPTION OF THE DRAWINGS

FIG. 7 is an exploded perspective view of part of the piezoelectric/electrostrictive actuator.

DETAILED DESCRIPTION OF THE INVENTION

Figure 1:
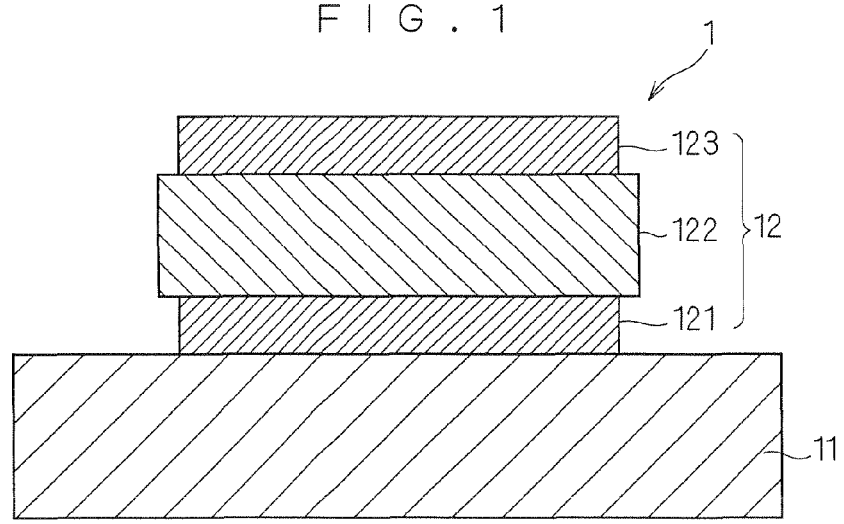
FIGS. 1 to 3 are a sectional view of a piezoelectric/electrostrictive actuator.

In the following, a piezoelectric/electrostrictive porcelain composition of the present invention is described, and subsequently, an actuator using the piezoelectric/electrostrictive porcelain composition is described. It is however noted that the following description does not mean that application of the piezoelectric/electrostrictive porcelain composition of the present invention is limited to an actuator. For example, the piezoelectric/electrostrictive porcelain composition of the present invention may be used for a piezoelectric/electrostrictive element such as a sensor.

<1. Piezoelectric/Electrostrictive Porcelain Composition>
{Composition}

The piezoelectric/electrostrictive porcelain composition of the present invention is obtained by adding a slight amount of a Mn compound to a perovskite type oxide, containing lithium (Li), sodium (Na) and potassium (K) as A-site elements and contains at least Niobium (Nb) out of Nb and tantalum (Ta) as B-site elements, where a ratio of a total number of atoms of the A-site elements to a total number of atoms of the B-site elements (so-called A/B ratio) is not smaller than 1. It is to be noted that the perovskite type oxide may further contain a univalent element of silver (Ag) or the like as the A-site element, and may further contain a quinquevalent element of antimony (Sb), vanadium (V) or the like as the B-site element. However, since electric field induced strain that occurs at the time of applying a high electric field can be increased in the piezoelectric/electrostrictive porcelain composition of the present invention even without Sb contained therein, it is preferable not to substantially contain Sb in the composition in the viewpoint of toxicity against a human body. Here, the purport of "not to substantially contain Sb" is "not to contain Sb in an amount exceeding an amount of Sb inevitably mixed in as an impurity.

The composition of the perovskite type oxide as a principal component is represented by a general formula: $\{Li_y(Na_{1-x}K_x)_{1-y}\}_a(Nb_{1-z}Ta_z)O_3$. a, x, y and z preferably satisfy $1<a\leq1.05$, $0.30\leq x\leq0.70$, $0.02\leq y\leq0.10$, and $0.0\leq z\leq0.5$.

The A/B ratio was set to $1<a$ for preventing hardening due to addition of the Mn compound as has been a problem in the conventional art. Namely, although it has conventionally been a technical common knowledge that addition of the Mn compound to the perovskite type oxide results in hardening with Mn functioning as an acceptor, it was found that as for the (Li, Na, K)(Nb, Ta)O$_3$ based piezoelectric/electrostrictive porcelain composition, adoption of a non-stoichiometric composition of $1<a$ can prevent hardening due to addition of the Mn compound, contrary to the conventional technical knowledge, so as to increase the electric field induced strain.

Meanwhile, $a\leq1.05$ was set because, if the A/B ratio exceeds this range, the other phase inside the sintered body increases, to decrease the electric field induced strain at the time of applying a high electric field, leading to an increase in dielectric loss. The increase in dielectric loss is a large concern for the piezoelectric/electrostrictive porcelain composition for an actuator to apply a high electric field.

$0.30\leq x\leq0.70$, $0.02\leq y\leq0.10$, and $0.0\leq z\leq0.5$ were set because within this range, a preferable piezoelectric/electrostrictive porcelain composition for an actuator can be obtained.

The Mn compound as an accessory component is desirably added such that the added amount is not more than 3 parts by mol in terms of Mn atom with respect to 100 parts by mol of the perovskite type oxide. The added amount of the Mn compound was set to not larger than 3 parts by mol because, if the added amount exceeds this range, the other phase inside the sintered body increases, to decrease the electric field induced strain at the time of applying a high electric field, leading to an increase in dielectric loss.

Here, adding the Mn compound even in a slight amount is sufficient. For example, even in the case of adding only 0.001 part by mol of the Mn compound in terms of Mn atom with respect to 100 parts by mol of the perovskite type oxide, a poling process on the sintered body is facilitated, so as to increase the electric field induced strain at the time of applying a high electric field.

The Mn compound is desirably a compound mainly composed of divalent Mn. For example, the Mn compound is desirably manganese oxide (MnO) or another compound of a solid solution formed by manganese, and is most preferably a compound of a solid solution formed by manganese with tri-lithium niobate (Li$_3$NbO$_4$). Here "mainly composed of divalent" means that a compound of Mn having a valence other than divalent can be contained so long as the valence contained in the largest amount is divalent. The valence of Mn can be checked by means of an X-ray absorption near-edge structure (XANES).

Further, Mn is desirably present inside the ceramic sintered body as an element constituting a other phase of the manganese compound, without being taken in a crystal lattice of the perovskite type oxide as a parent phase.

Introducing such a Mn compound into the sintered body can prevent hardening due to addition of the Mn compound, so as to increase the electric field induced strain.

{Production of Ceramic Powder}

In producing a ceramic powder of the piezoelectric/electrostrictive porcelain composition, first, raw materials of the constitutional elements (Li, Na, K, Nb, Ta, Mn, etc.) of the piezoelectric/electrostrictive porcelain composition are added with a dispersion medium, and then mixed using a ball mill or the like. As the raw material, a compound of an oxide, carbonate, tartrate or the like can be used. As the dispersion medium, an organic solvent such as ethanol, toluene or acetone can be used. The dispersion medium is removed from the obtained mixed slurry by techniques such as vaporization-drying, filtering, and the like, to obtain a mixed material. Subsequently, the mixed material is fired at 600 to 1300° C. so that a ceramic powder can be obtained. It is to be noted that the powder may be ground using the ball mill or the like for obtaining a ceramic powder with a desired particle size. Further, producing the ceramic powder not by solid-phase reaction method but by alcoxide method or coprecipitation method is also possible. Moreover, after synthesis of the perovskite type oxide, a raw material of Mn to supply Mn constituting the Mn compound may be added. In this case, manganese dioxide (MnO$_2$) is desirably added as the raw material of Mn to the synthesized perovskite type oxide. Quadrivalent Mn constituting manganese dioxide as thus added is reduced to divalent Mn during firing, to contribute to improvement in electric field induced strain. Further, the perovskite type oxide may be synthesized via a columbite compound of the B-site element.

An average particle size of the ceramic powder is preferably from 0.07 to 10 μm, and further preferably from 0.1 to 3 μm. The ceramic powder may be subjected to thermal treatment at 400 to 850° C. for adjustment of the particle size of the ceramic powder. With this thermal treatment performed, a finer particle is more apt to be combined with another particle, and hence a ceramic powder having a uniform particle size can be obtained and a sintered body having a uniform grain size can thus be obtained.

<2. Piezoelectric/Electrostrictive Actuator>

{Overall Structure}

Figure 2:
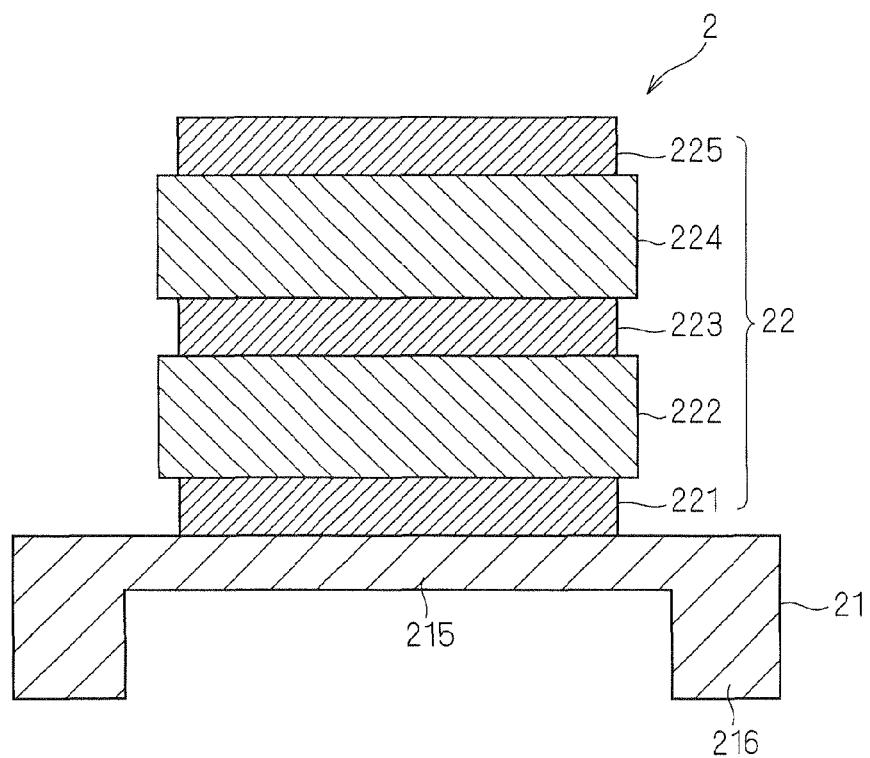

FIGS. 1 and 2 show schematic views of constitutional examples of piezoelectric/electrostrictive actuators 1, 2, using the foregoing piezoelectric/electrostrictive porcelain composition. FIG. 1 is a sectional view of a mono-layered piezoelectric/electrostrictive actuator 1, and FIG. 2 a sectional view of a multi-layered piezoelectric/electrostrictive actuator 2.

As shown in FIG. 1, the piezoelectric/electrostrictive actuator 1 has a configuration where an electrode film 121, a piezoelectric/electrostrictive film 122, and an electrode film 123 are laminated in this order on a substrate 11. The electrode films 121, 123 on both principal surfaces of the piezoelectric/electrostrictive film 122 are opposed to each other with the piezoelectric/electrostrictive film 122 sandwiched therebetween. The laminated body 12 where the electrode film 121, the piezoelectric/electrostrictive film 122 and the piezoelectric/electrostrictive film 123 are laminated is solidly bonded to the substrate 11.

Further, as shown in FIG. 2, the piezoelectric/electrostrictive actuator 2 has a configuration where an electrode film 221, a piezoelectric/electrostrictive film 222, an electrode film 223, a piezoelectric/electrostrictive film 224, and an electrode film 225 are laminated in this order on a substrate 21. The electrode films 221, 223 on both principal surfaces of the piezoelectric/electrostrictive film 222 are opposed to each other with the piezoelectric/electrostrictive film 222 sandwiched therebetween, and the electrode films 223, 225 on both principal surfaces of the piezoelectric/electrostrictive film 224 are opposed to each other with the piezoelectric/electrostrictive film 224 sandwiched therebetween. The laminated body 22 where the electrode film 221, the piezoelectric/electrostrictive film 222, the electrode film 223, the piezoelectric/electrostrictive film 224 and the electrode film 225 are laminated is solidly bonded to the substrate 21. It is to be noted that although FIG. 2 shows the case of the piezoelectric/electrostrictive films being formed of two layers, the piezoelectric/electrostrictive films may be formed of three layers or layers in larger number.

Here, "solidly bonded" means that the laminated bodies 12, 22 are bonded to the substrates 11, 12 by solid phase reaction on the interfaces between the substrates 11, 21 and the laminated bodies 12, 22 without the use of an organic adhesive nor an inorganic adhesive. It is to be noted that the laminated body may be bonded to the substrate by solid-phase reaction on the interface between the substrate and the lowest layer of the laminated body of the piezoelectric/electrostrictive films.

In the piezoelectric/electrostrictive actuators 1, 2, upon application of a voltage, the piezoelectric/electrostrictive films 122, 222, 224 are expanded and contracted in a direction vertical to an electric field in accordance with the applied voltage, resulting in occurrence of flexural displacement.

{Piezoelectric/Electrostrictive Film}

The piezoelectric/electrostrictive films 122, 222, 224 are sintered bodies of the foregoing piezoelectric/electrostrictive porcelain composition.

The film thicknesses of the piezoelectric/electrostrictive films 122, 222, 224 are preferably from 0.5 to 50 μm, further preferably from 0.8 to 40 μm, and especially preferably from 1 to 30 μm. This is because, when the thicknesses fall below this range, the piezoelectric/electrostrictive films tend to be insufficiently densified. Further, when the thicknesses exceed this range, shrinkage stress that occurs at the time of firing increases, which necessitates an increase in thicknesses of the substrates 11, 21, thereby making it difficult to reduce the sizes of the piezoelectric/electrostrictive actuators 1, 2.

{Piezoelectric/Electrostrictive Film}

A material for the electrode films 121, 123, 221, 223, 225 is a metal such as platinum, palladium, rhodium, gold or silver, or an alloy of these metals. Above all, platinum or an alloy mainly composed of platinum is preferable since having high thermal resistance at the time of firing. Further, an alloy such as a silver-palladium alloy is preferably usable depending upon a firing temperature.

The film thicknesses of the electrode films 121, 123, 221, 223, 225 are preferably not larger than 15 μm, and further preferably not larger than 5 μm. This is because, when the thicknesses exceed this range, the electrode films 121, 123, 221, 223, 225 function as relaxing layers, and the flexural displacement tends to be reduced. Further, for appropriate functioning of the electrode films 121, 123, 221, 223, 225, the film thicknesses thereof are preferably not smaller than 0.05 μm.

The electrode films 121, 123, 221, 223, 225 are preferably formed so as to cover a region that substantially contributes to the flexural displacement of the piezoelectric/electrostrictive films 122, 222, 224. For example, the electrode films are preferably formed so as to include the central portions of the piezoelectric/electrostrictive films 122, 222, 224 and cover not less than 80% of the region of both principal surfaces of the piezoelectric/electrostrictive films 122, 222, 224.

{Substrate}

A material for the substrates 11, 21 is a ceramic, and the kind of the ceramic is not especially limited. However, from the view points of thermal resistance, chemical stability, and an insulating property, a ceramic is preferably selected which contains at least one selected from the group consisting of stabilized zirconium oxide, aluminum oxide, magnesium oxide, mullet, aluminum nitride, silicon nitride, and glass. Above all, stabilized zirconium oxide is further preferable from the viewpoints of mechanical strength and tenacity. Here, "stabilized zirconium oxide" refers to zirconium oxide in which crystal phase transition is inhibited by addition of a stabilizer, and which includes partially stabilized zirconium oxide in addition to stabilized zirconium oxide.

Examples of stabilized zirconium oxide may include zirconium oxide containing, as a stabilizer, 1 to 30 mol% of calcium oxide, magnesium oxide, yttrium oxide, ytterbium oxide, cerium oxide, or oxide of a rare earth metal. Above all, zirconium oxide with yttrium oxide contained therein as the stabilizer is preferable in the view point of especially high mechanical strength. The content of ytterbium oxide is preferably from 1.5 to 6 mol%, and further preferably from 2 to 4 mol%. Moreover, 0.1 to 5 mol% of aluminum oxide is further preferably contained in addition to yttrium oxide. While a crystal phase of stabilized zirconium oxide may be a mixed crystal of a cubic crystal and monoclinic crystal, a mixed crystal of tetragonal crystal and the monoclinic crystal, a mixed crystal of the cubic crystal, the tetragonal crystal, and the monoclinic crystal, or the like, it is preferable that a main crystal be the tetragonal crystal or the mixed crystal of the tetragonal crystal and the cubic crystal from the viewpoints of strength, tenacity and durability.

The plate thicknesses of the substrates 11, 12 are preferably from 1 to 1000 μm, further preferably from 1.5 to 500 μm, and especially preferably from 2 to 200 μm. This is because, when the thicknesses fall below this range, the mechanical strengths of the piezoelectric/electrostrictive actuators 1, 2 tend to decrease. And this is also because, when the thicknesses exceed this range, the rigidities of the substrates 11, 21 tend to increase, thereby causing a decrease in flexural displacement by extraction and contraction of the piezoelectric/electrostrictive films 122, 222, 224 in the case of applying a voltage.

The surface shapes (shapes of surfaces to which the laminated body is solidly bonded) of the substrates 11, 21 are not especially limited, and can be formed in triangular shape, quadrangular (rectangular or square) shape, elliptic shape, or circular shape. As for the triangular shape and the quadrangular shape, the corners thereof can be rounded. The surface shapes may be formed in complex shape in combination of these standard shapes.

The plate thickness of the substrate 11 in the mono-layered piezoelectric/electrostrictive actuator 1 is uniform. As opposed to this, the plate thickness of the substrate 21 in the multi-layered piezoelectric/electrostrictive actuator 2 is formed such that a central portion 215 to which the laminated body 22 is bonded is thinner than a peripheral portion 216. This formation is aimed at increasing the flexural displacement while keeping the mechanical strength of the substrate 21. It is to be noted that the substrate 21 may be used in the mono-layered piezoelectric/electrostrictive actuator 1.

Figure 3:
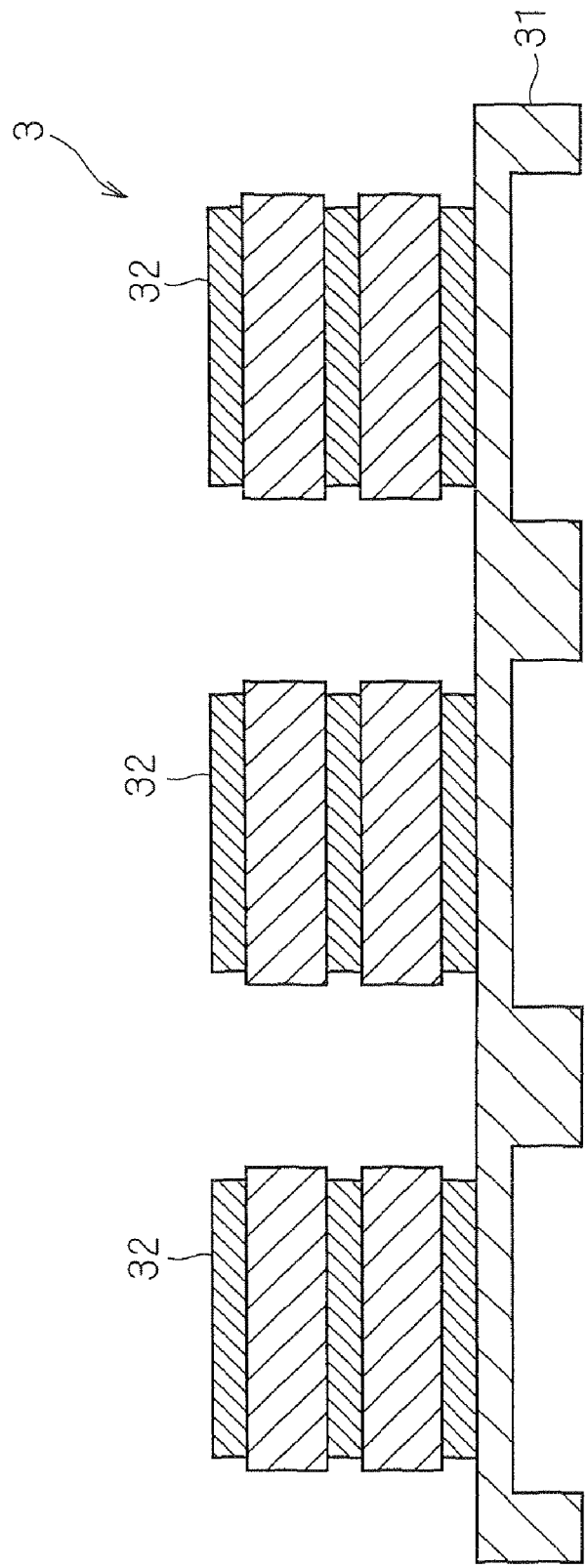

In addition, as shown in the sectional view of FIG. 3, a substrate 31 may be used where the substrate 21 as a unit structure shown in FIG. 2 is repeatedly formed. In this case, a laminated body 32 is solidly bonded onto each of the unit structures, to constitute a piezoelectric/electrostrictive actuator 3.

{Production of Piezoelectric/Electrostrictive Actuator}

In manufacturing the mono-layered piezoelectric/electrostrictive actuator 1, first, the electrode film 121 is formed on the substrate 11. The electrode film 121 can be formed by ion beaming, sputtering, vacuum evaporation, PVD (Physical Vapor Deposition), ion plating, CVD (Chemical Vapor Deposition), plating, aerosol deposition, screen printing, spraying, dipping, or some other methods. Above all, sputtering or screen printing is preferable from the viewpoint of a bonding property between the substrate 11 and the piezoelectric/electrostrictive film 122. The formed electrode film 121 can be solidly bonded to the substrate 11 and the piezoelectric/electrostrictive film 122 by thermal treatment. The thermal treatment temperature is approximately from 500 to 1400° C. although it varies depending upon the material or the formation method for the electrode film 121.

Subsequently, the piezoelectric/electrostrictive film 122 is formed on the electrode film 121. The piezoelectric/electrostrictive film 122 can be formed by ion beaming, sputtering, vacuum evaporation, PVD (Physical Vapor Deposition), ion plating, CVD (Chemical Vapor Deposition), plating, sol-gel, aerosol deposition, screen printing, spraying, dipping, or some other methods. Above all, screen printing is preferable in that a flat surface shape and a film thickness are highly accurate so as to allow successive formation of the piezoelectric/electrostrictive films.

Further subsequently, the electrode film 123 is formed on the piezoelectric/electrostrictive film 122. The electrode film 123 can be formed in the same manner as the electrode film 121.

Thereafter, the substrate 11 with the laminated body 12 formed thereon is integrally fired. By this firing, sintering of the piezoelectric/electrostrictive film 122 proceeds, and the electrode films 121, 123 are subjected to thermal treatment. The firing temperature of the piezoelectric/electrostrictive film 122 is preferably from 800 to 1250° C., and further preferably from 900 to 1200° C. This is because, when the temperature falls below this range, the piezoelectric/electrostrictive film 122 tends to be insufficiently densified, and hence solid boding between the substrate 11 and the electrode film 121 or solid bonding between the electrode films 121, 123 and the piezoelectric/electrostrictive film 122 tend to be incomplete. This is also because, when the temperature exceeds this range, a piezoelectric/electrostrictive characteristic of the piezoelectric/electrostrictive film 122 tends to deteriorate. Moreover, when the highest temperature retaining time at the time of firing is preferably from 1 minute to 10 hours, and further preferably from 5 minutes to 4 hours. This is because, when the temperature falls below this range, the piezoelectric/electrostrictive film 122 tends to be insufficiently densified. Further, when the temperature exceeds this range, the piezoelectric/electrostrictive characteristic of the piezoelectric/electrostrictive film 122 tend to deteriorate.

In addition, although it is preferable to perform thermal treatment on the electrode films 121, 123 concurrently with firing from the view point of productivity, it is also possible to perform the thermal treatment upon formation of each of the electrode films 121, 123. However, in the case of firing the piezoelectric/electrostrictive film 122 prior to the thermal treatment on the electrode film 123, the thermal treatment is performed on the electrode film 123 at a temperature lower than the firing temperature of the piezoelectric/electrostrictive film 122.

After the firing, a poling process is performed on appropriate conditions. The poling process can be performed by a known technique, and is preferably set to a heating temperature of 40 to 200° C. although the heating temperature depends upon a Curie temperature of the piezoelectric/electrostrictive film 122.

It is to be noted that the multi-layered piezoelectric/electrostrictive actuator 2 can be manufactured in the same manner as the mono-layered piezoelectric/electrostrictive actuator 1 except that the numbers of piezoelectric/electrostrictive films and electrode films increase.

Further, the piezoelectric/electrostrictive actuator 1 can also be manufactured by green sheet laminating method regularly used in manufacturing of a laminated ceramic electric component. In the green sheet laminating method, first, a ceramic powder is added with a binder, a plasticizer, a dispersant, and a dispersion medium, and then mixed using the ball mill or the like. The obtained slurry is formed into sheet shape by doctor blading or the like, so as to give a formed body.

Subsequently, a film of an electrode paste is printed on each principal surface of the formed body by screen printing or the like. The electrode paste used here is obtained by adding a solvent, vehicle, glass flit, and the like, to the foregoing metal or an alloy thereof.

Further subsequently, the formed body with the electrode paste film printed on each of the principal surfaces thereof is press-bonded to the substrate.

Thereafter, the substrate with the laminated body formed thereon is integrally fired, and after the firing, the poling process is performed on appropriate conditions.

<3. Another Example of Piezoelectric/Electrostrictive Actuator>

Figure 4:
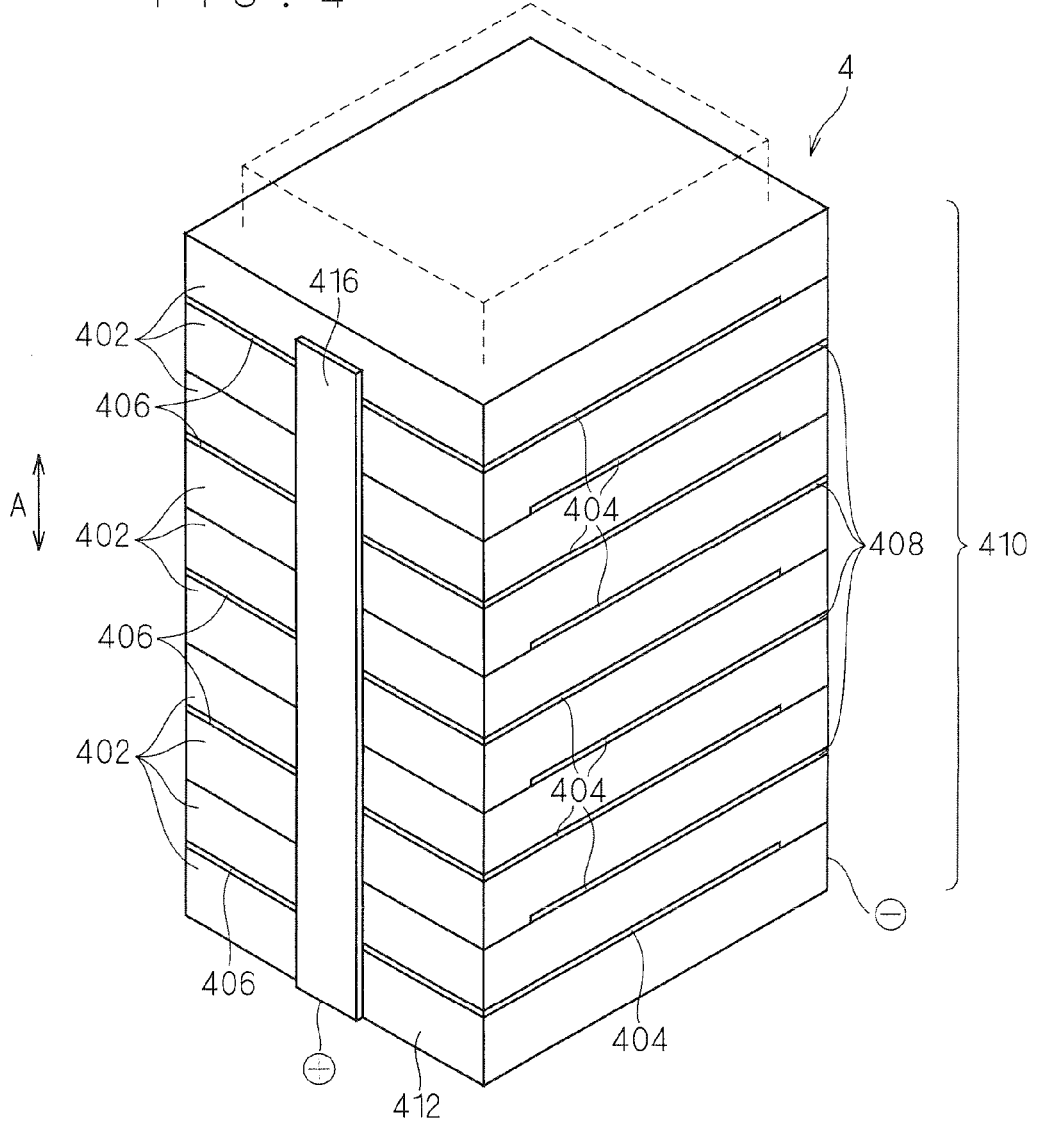
FIG. 4 is a perspective view of a piezoelectric/electrostrictive actuator.
Figure 5:
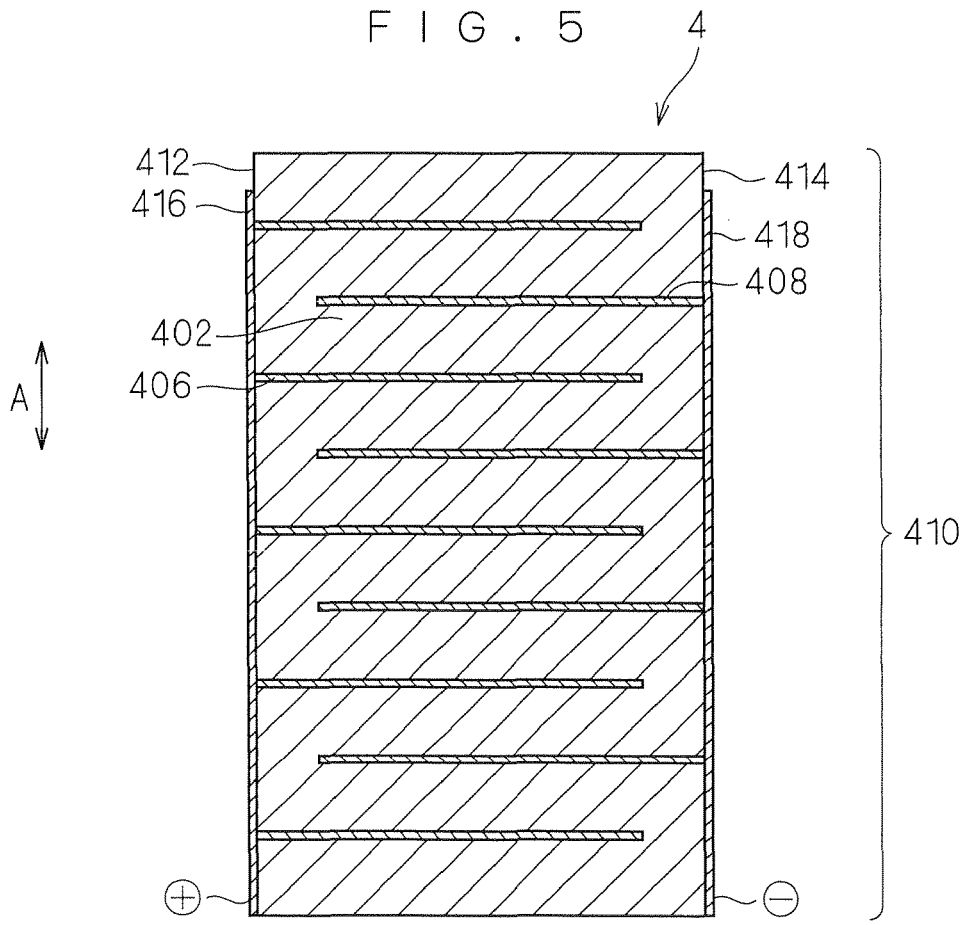
FIG. 5 is a vertical sectional view of the piezoelectric/electrostrictive actuator.
Figure 6:
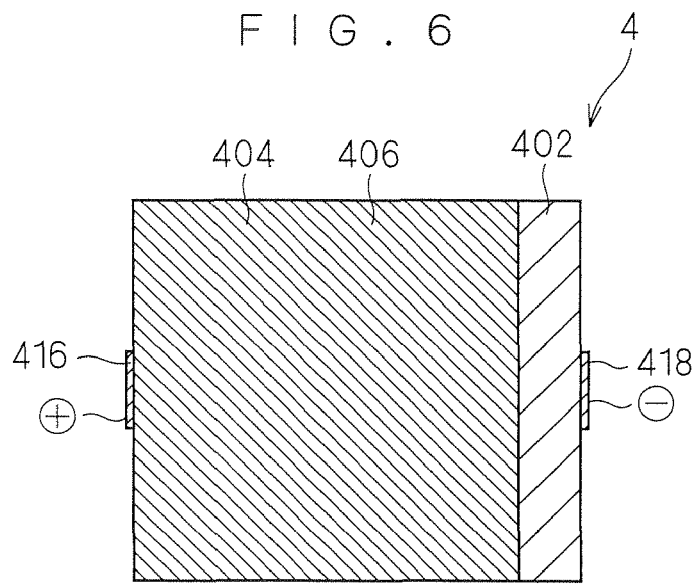
FIG. 6 is a lateral sectional view of the piezoelectric/electrostrictive actuator.

FIGS. 4 to 6 are schematic views of a structural example of a piezoelectric/electrostrictive actuator 4 using the foregoing piezoelectric/electrostrictive porcelain composition. FIG. 4 is a perspective view of the piezoelectric/electrostrictive actuator 4, FIG. 5 is a vertical sectional view of the piezoelectric/electrostrictive actuator 4, and FIG. 6 is a lateral sectional view of the piezoelectric/electrostrictive actuator 4.

As shown in FIGS. 4 to 6, the piezoelectric/electrostrictive actuator 4 has a structure where piezoelectric/electrostrictive films 402 and internal electrode films 404 are alternately laminated in a direction of an axis A, and external electrode films 416, 418 are formed on end surfaces 412, 414 of a laminated body 410 formed by laminating the piezoelectric/electrostrictive films 402 and the internal electrode films 404. As shown in an exploded perspective view of FIG. 7 showing a state where part of the piezoelectric/electrostrictive actuator 4 have been exploded in the direction of the axis A, the internal electrode films 404 are comprised of: first internal electrode films 406 that reach the end surface 412 but do not reach the end surface 414; and second internal electrode films 408 that reach the end surface 414 but do not reach the end surface 412. The first internal electrode films 406 and the second internal electrode films 408 are alternately provided. The first internal electrode films 406 are in contact with the external electrode film 416 on the end surface 412, and electrically connected to the external electrode film 416. The second internal electrode films 408 are in contact with the external electrode film 418 on the end surface 414, and electrically connected to the external electrode film 418. Therefore, when the external electrode film 416 is connected to a plus side of a driving signal source and the external electrode film 418 is connected to a minus side of the driving signal source, a driving signal is applied to the first internal electrode film 406 and the second internal electrode film 408 which are opposed to each other with the piezoelectric/electrostrictive film 402 sandwiched therebetween, and an electric field is applied in the thickness direction of the piezoelectric/electrostrictive film 402. This results in expansion and contraction of the piezoelectric/electrostrictive film 402 in the thickness direction, and the laminated body 410 is transformed as a whole into a shape indicated by broken lines in FIG. 4.

In contrast to the already described piezoelectric/electrostrictive actuators 1 to 3, the piezoelectric/electrostrictive actuator 4 does not have a substrate to which the laminated body 410 is solidly bonded. Further, since the piezoelectric/electrostrictive actuator 4 is alternately provided with the first internal electrode films 406 and the second internal electrode films 408 which have different patterns, it is also called an "offset type piezoelectric/electrostrictive actuator".

The piezoelectric/electrostrictive film 402 is a sintered body of the foregoing piezoelectric/electrostrictive porcelain composition. The film thickness of the piezoelectric/electrostrictive film 402 is preferably from 5 to 500 μm. This is because, when the thickness falls below this range, manufacturing of a later-described green sheet becomes difficult. This is also because, when the thickness exceeds this range, applying a sufficient electric field to the piezoelectric/electrostrictive film 402 becomes difficult.

A material for the internal electrode film 404 and the external electrode films 416, 418 is platinum, palladium, rhodium, gold or silver, or an alloy of these metals. Above all, platinum or an alloy mainly composed of platinum is preferable as the material for the internal electrode film 404 in that thermal resistance is high at the time of firing and co-sintering with the piezoelectric/electrostrictive film 402 is easily performed. However, a silver-palladium alloy is also preferably usable depending upon the firing temperature.

The film thickness of the internal electrode film 402 is preferably not larger than 10 μm. This is because, when the thickness exceeds this range, the internal electrode film 402 functions as a relaxing layer, and the flexural displacement tends to be reduced. Further, for appropriate functioning of the internal electrode film 402, the film thickness thereof is preferably not smaller than 0.1 μm.

It is to be noted that, although the case is shown where the number of layers of the piezoelectric/electrostrictive films 402 is ten, the number may be nine or smaller, or eleven or larger.

In manufacturing of the piezoelectric/electrostrictive actuator 4, first, a ceramic powder of the foregoing piezoelectric/electrostrictive porcelain composition is added with a binder, a plasticizer, a dispersant, and a dispersion medium, and then mixed using the ball mill or the like. The obtained slurry is then formed into sheet shape by doctor blading or the like, so as to give a green sheet.

Subsequently, the green sheets are subjected to a punching process using a punch and die, to form a hole for alignment or the like.

Further subsequently, an electrode paste is applied on the surface of the green sheet by screen printing or the like, to give the green sheet with a pattern of the electrode paste formed thereon. There are two kinds of patterns of the electrode paste: a pattern of a first electrode paste to be the first internal electrode film 406 after firing; and a pattern of a second electrode paste to be the second internal electrode film 408 after firing. Needless to say, only one kind of pattern of the electrode paste may be applied, and the internal electrode films 406, 408 may be obtained by alternately rotating the green sheets at 180 degrees.

Next, after the green sheets with the first electrode paste pattern formed thereon and the green sheets with the second electrode paste pattern formed thereon have been alternately laminated and a green sheet with no electrode paste applied thereon has further been placed on the top portion, the laminated green sheets are pressurized for press-bonding in the thickness direction. At this time, the holes for alignment formed in the green sheets are aligned. Further, in press-bonding of the laminated green sheets, it is also desirable to previously heat a mold to be used for press-bonding so as to perform press-bonding while heating.

The press-bonded body of the green sheets as thus obtained is fired and the obtained sintered body is processed using a dicing saw or the like, so that the laminated body 410 can be obtained. Subsequently, the external electrode films 416, 418 are formed on the end surfaces 412, 414 of the laminated body 410 by baking, vapor deposition, sputtering and the like, and the poling process is then performed, so that the piezoelectric/electrostrictive actuator 4 can be obtained.

EXAMPLES

In the following, examples of the present invention and comparative examples out of the scope of the present invention are described. However, the below-mentioned examples do not limit the scope of the present invention.

First, raw materials such as lithium carbonate ($Li_2CO_3$), sodium bitartrate monohydrate ($C_6H_5O_6Na\,H_2O$), potassium bitartrate ($C_6H_5O_6K$), niobium oxide ($Nb_2O_5$), tantalum oxide ($Ta_2O_5$), and manganese dioxide ($MnO_2$) were weighed so as to have compositions shown in Tables 1 and 2. The raw materials except for manganese diode $MnO_2$ were added with alcohol as a dispersion medium, and then mixed using the ball mill. The obtained mixed raw material was calcined at 800° C. for five hours and pulverized using the ball mill, and such calcination and pulverization are repeated twice, to give a ceramics powder for the piezoelectric/electrostrictive porcelain composition. Further, after the calcination had been performed twice, the ceramics powder of the piezoelectric/electrostrictive porcelain composition was added with $MnO_2$ so as to have the compositions as shown in Tables 1 and 2, and also added with alcohol as the dispersion medium, followed by mixing and pulverization using the ball mill.

Subsequently, the ceramics powder was press-formed at a pressure of $2.0 \times 10^8$ Pa into disc shape of a diameter of 20 mm and a thickness of 6 mm. Subsequently, the press-formed body was housed inside an alumina container and fired at 900 to 1100° C. for three hours, to give a sintered body (piezoelectric/electrostrictive body).

Further subsequently, the sintered body was processed into rectangular shape of 12 mm in long side, 3 mm in short side and 1 mm in thickness, and on each principal surface thereof, a gold electrode was formed by sputtering. This was immersed in silicon oil at room temperature, and a voltage of 5 kV/mm was applied to the gold electrode on each principal surface, to perform a poling process in the thickness direction.

As for such a piezoelectric/electrostrictive element, a piezoelectric constant $d_{31}$(pC/N) as an indicator of a piezoelectric property, a maximum phase angle $\theta_{max}$(deg) as an indicator of easiness to perform the poling process, and a strain ratio $S_{4000}$(ppm) as an indicator of magnitude of the electric field induced strain at a time of applying a high electric field were measured. The piezoelectric constant $d_{31}$ (pC/N) was obtained such that a frequency-impedance characteristic of the piezoelectric/electrostrictive element and an electric capacitance were measured with an impedance analyzer, to calculate the constant from a resonance frequency and non-resonance frequency of a fundamental wave of a long-side of vibration extending in a long-side direction, the electric capacitance, and a size. The maximum phase angle $\theta_{max}$ was obtained such that a frequency-impedance characteristic and a frequency-phase characteristic of the piezoelectric/electrostrictive element were measured with the impedance analyzer, to specify the maximum value of a phase between the resonance frequency and non-resonance frequency of the fundamental wave of vibration extending in the long-side direction. The strain ratio $S_{4000}$ was obtained by measuring electric field induced strain in the long-side direction at the time of applying a voltage of 4 kV/mm to the gold electrode on each principal surface with a strain gauge attached on the electrode. The "Amount of Mn" in Table 1 showing the measurement result shows an amount of the added Mn compound in units of parts by mol in terms of Mn atom with respect to 100 parts by mol of the perovskite type oxide.

As shown in Table 1, in Examples 1 to 4 in which 100 parts by mol of the principal component having a composition: $\{Li_{0.06}(Na_{0.55}K_{0.45})_{0.94}\}_{1.01}(Nb_{0.918}Ta_{0.082})O_3$, where x=0.45, y=0.06, z=0.082, and a=1.01, was added with 0.001 to 3.00 parts by mol of the Mn compound as the accessory component, the piezoelectric constant $d_{31}$, the maximum phase angle $\theta_{max}$ and the strain ratio $S_{4000}$ increase in larger scales than in Comparative Example 1 in which the Mn compound is not added. That is, it was found that addition of the Mn compound can largely increase the piezoelectric constant $d_{31}$, the maximum phase angle $\theta_{max}$ and the strain ratio $S_{4000}$, and that the added amount of the Mn compound being as slight as 0.001 part by mol is sufficient.

TABLE 1

| | Composition | Amount of Mn | Piezoelectric constant $d_{31}$ | Strain ratio $S_{4000}$ | Maximum phase angle $\theta$ max |
|---|---|---|---|---|---|
| Comparative example 1 * | $100\{Li_{0.06}(Na_{0.55}K_{0.45})_{0.94}\}_{1.01}(Nb_{0.918}Ta_{0.082})O_3$ | 0 | 38 | 400 | 5 |
| Example 1 | $100\{Li_{0.06}(Na_{0.55}K_{0.45})_{0.94}\}_{1.01}(Nb_{0.918}Ta_{0.082})O_3$ | 0.001 | 61 | 585 | 40 |
| Example 2 | $100\{Li_{0.06}(Na_{0.55}K_{0.45})_{0.94}\}_{1.01}(Nb_{0.918}Ta_{0.082})O_3$ | 0.02 | 65 | 620 | 45 |
| Example 3 | $100\{Li_{0.06}(Na_{0.55}K_{0.45})_{0.94}\}_{1.01}(Nb_{0.918}Ta_{0.082})O_3$ | 0.1 | 64 | 610 | 42 |
| Example 4 | $100\{Li_{0.06}(Na_{0.55}K_{0.45})_{0.94}\}_{1.01}(Nb_{0.918}Ta_{0.082})O_3$ | 3 | 57 | 545 | 40 |

Further, as shown in Table 2, in Examples 5 to 7 in which 100 parts by mol of the principal component having a composition: $\{Li_{0.06}(Na_{0.55}K_{0.45})_{0.94}\}_a(Nb_{0.918}Ta_{0.082})O_3$, where x=0.45, y=0.06, and z=0.082, with an A/B ratio changed in the range of $1.0005 \leq a \leq 1.05$, is added with 0.02 part by mol of the Mn compound as the accessory component, the piezoelectric constant $d_{31}$ and the strain ratio $S_{4000}$ increase in larger scales than in Comparative Example 3 where a=0.995. Namely, it was found that, when 1<a is set, addition of the Mn compound can largely improve the piezoelectric constant $d_{31}$ and the strain ratio $S_{4000}$. On the other hand, as shown in Comparative Examples 2 to 3, when $1 \geq a$, addition of the Mn compound cannot improve the piezoelectric constant $d_{31}$ and the strain ratio $S_{4000}$.

TABLE 2

| | Composition | Amount of Mn | Piezoelectric constant $d_{31}$ | Strain ratio $S_{4000}$ |
|---|---|---|---|---|
| Comparative example 2 * | $100\{Li_{0.06}(Na_{0.55}K_{0.45})_{0.94}\}_{0.995}(Nb_{0.918}Ta_{0.082})O_3$ | 0 | 32 | 310 |
| Comparative example 3 | $100\{Li_{0.06}(Na_{0.55}K_{0.45})_{0.94}\}_{0.995}(Nb_{0.918}Ta_{0.082})O_3$ | 0.02 | 30 | 290 |
| Example 5 | $100\{Li_{0.06}(Na_{0.55}K_{0.45})_{0.94}\}_{1.0005}(Nb_{0.918}Ta_{0.082})O_3$ | 0.02 | 58 | 535 |
| Example 6 | $100\{Li_{0.06}(Na_{0.55}K_{0.45})_{0.94}\}_{1.005}(Nb_{0.918}Ta_{0.082})O_3$ | 0.02 | 63 | 600 |
| Example 7 | $100\{Li_{0.06}(Na_{0.55}K_{0.45})_{0.94}\}_{1.05}(Nb_{0.918}Ta_{0.082})O_3$ | 0.02 | 52 | 475 |
| Example 8 | $100\{Li_{0.02}(Na_{0.55}K_{0.45})_{0.98}\}_{1.01}(Nb_{0.918}Ta_{0.082})O_3$ | 0.02 | 51 | 455 |
| Example 9 | $100\{Li_{0.10}(Na_{0.55}K_{0.45})_{0.90}\}_{1.01}(Nb_{0.918}Ta_{0.082})O_3$ | 0.02 | 52 | 460 |
| Comparative example 4* | $100\{Li_{0.06}(Na_{0.70}K_{0.30})_{0.94}\}_{1.01}(Nb_{0.918}Ta_{0.082})O_3$ | 0 | 34 | 280 |
| Example 10 | $100\{Li_{0.06}(Na_{0.70}K_{0.30})_{0.94}\}_{1.01}(Nb_{0.918}Ta_{0.082})O_3$ | 0.02 | 52 | 455 |
| Example 11 | $100\{Li_{0.06}(Na_{0.30}K_{0.70})_{0.94}\}_{1.01}(Nb_{0.918}Ta_{0.082})O_3$ | 0.02 | 58 | 515 |
| Example 12 | $100\{Li_{0.06}(Na_{0.55}K_{0.45})_{0.94}\}_{1.01}(Nb_{1.000})O_3$ | 0.02 | 54 | 485 |
| Example 13 | $100\{Li_{0.06}(Na_{0.55}K_{0.45})_{0.94}\}_{1.01}(Nb_{0.500}Ta_{0.5000})O_3$ | 0.02 | 58 | 510 |
| Example 14 | $100\{Li_{0.04}(Na_{0.70}K_{0.30})_{0.96}\}_{1.0005}(Nb_{1.000})O_3$ | 0.001 | 45 | 455 |
| Example 15 | $100\{Li_{0.08}(Na_{0.35}K_{0.65})_{0.92}\}_{1.05}(Nb_{0.500}Ta_{0.5000})O_3$ | 3 | 48 | 485 |

Further, it was found that, as shown in Examples 8 to 13 in which the composition of the principal component of Example 2 was variously changed, even the composition (x, y, z) of the principal component is variously changed within the range of the present invention, favorable piezoelectric constant $d_{31}$ and strain ratio $S_{4000}$ can be held. In addition, it was found that, as shown in Example 14 in which the composition of the principal component of Example 1 was changed to: $\{Li_{0.04}(Na_{0.70}K_{0.30})_{0.96}\}_{1.0005}NbO_3$, where x=0.30, y=0.04, z=0.000, a=1.0005, and in Example 15 in which the composition of the principal component of Example 4 was changed to $\{Li_{0.08}(Na_{0.35}K_{0.65})_{0.92}\}_{1.05}(Nb_{0.500}Ta_{0.500})O_3$, where x=0.65, y=0.08, z=0.500, and a=1.05, even the composition (a, x, y, z) of the principal component is variously changed within the range of the present invention, favorable piezoelectric constant $d_{31}$ and strain ratio $S_{4000}$ can be held.

It is however noted that, as apparent from the comparison between Example 10 and Comparative example 4, even when the composition of the principal component is the same, piezoelectric constant $d_{31}$ and strain ratio $S_{4000}$ significantly decrease without addition of the Mn compound.

While the invention has been shown and described in detail, the foregoing description is in all aspects illustrative and not restrictive. It is therefore understood that numerous modifications and variations can be devised without departing from the scope of the invention.

What is claimed is:

1. A piezoelectric/electrostrictive porcelain composition, comprising:
    a perovskite type oxide, containing Li, Na and K as A-site elements and contains at least Nb out of Nb and Ta as B-site elements, where a ratio of a total number of atoms of the A-site elements to a total number of atoms of the B-site elements is not smaller than 1; and
    a Mn compound, added to said perovskite type oxide,
    wherein a composition of said perovskite type oxide is represented by a general formula: $\{Li_y(Na_{1-x}K_x)_{1-y}\}_a(Nb_{1-z}Ta_z)O_3$, wherein a, x, y and z satisfy $1 < a \leq 1.05$, $0.30 \leq x \leq 0.70$, $0.02 \leq y \leq 0.10$, and $0.0 \leq z \leq 0.5$.

2. The piezoelectric/electrostrictive porcelain composition according to claim 1,
    wherein an added amount of said Mn compound is not more than 3 parts by mol in terms of Mn atom with respect to 100 parts by mol of said perovskite type oxide.

3. The piezoelectric/electrostrictive porcelain composition according to claim 1,
    wherein said piezoelectric/electrostrictive porcelain composition does not substantially contain Sb.

4. The piezoelectric/electrostrictive porcelain composition according to claim 1,
    wherein said Mn compound is mainly composed of divalent Mn.

5. The piezoelectric/electrostrictive porcelain composition according to claim 1,
    wherein said Mn compound is present inside a ceramic sintered body as a other phase with respect to said perovskite type oxide as a parent phase.

6. A piezoelectric/electrostrictive element, comprising:
    a piezoelectric/electrostrictive film as a sintered body of a piezoelectric/electrostrictive porcelain composition; and
    electrode films on both principal surfaces of said piezoelectric/electrostrictive film;
    wherein said piezoelectric/electrostrictive porcelain composition comprises
        a perovskite type oxide, containing Li, Na and K as A-site elements and contains at least Nb out of Nb and Ta as B-site elements, where a ratio of a total number of atoms of the A-site elements to a total number of atoms of the B-site elements is not smaller than 1, and
        a Mn compound, added to said perovskite type oxide,
        wherein a composition of said perovskite type oxide is represented by a general formula: $\{Li_y(Na_{1-x}K_x)_{1-y}\}_a(Nb_{1-z}Ta_z)O_3$, wherein a, x, y and z satisfy $1 < a \leq 1.05$, $0.30 \leq x \leq 0.70$, $0.02 \leq y \leq 0.10$, and $0.0 \leq z \leq 0.5$.

* * * * *